(12) United States Patent
DenBaars et al.

(10) Patent No.: US 8,035,117 B2
(45) Date of Patent: *Oct. 11, 2011

(54) MULTI ELEMENT, MULTI COLOR SOLID STATE LED/LASER

(75) Inventors: Steven P. DenBaars, Goleta, CA (US); Eric J. Tarsa, Goleta, CA (US); Michael Mack, Santa Barbara, CA (US); Bernd Keller, Goleta, CA (US); Brian Thibeault, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/484,233

(22) Filed: Jul. 10, 2006

(65) Prior Publication Data

US 2006/0255347 A1    Nov. 16, 2006

Related U.S. Application Data

(60) Continuation of application No. 10/815,426, filed on Mar. 31, 2004, now Pat. No. 7,084,436, which is a division of application No. 09/528,262, filed on Mar. 17, 2000, now Pat. No. 7,202,506.

(60) Provisional application No. 60/166,444, filed on Nov. 19, 1999.

(51) Int. Cl.
*H01L 33/00* (2010.01)

(52) U.S. Cl. ........... 257/89; 257/101; 257/E33.061; 257/E33.068

(58) Field of Classification Search .......... 257/89
See application file for complete search history.

(56) References Cited

U.S. PATENT DOCUMENTS 4,992,302 A    2/1991    Lindmayer .......... 427/70
(Continued)

FOREIGN PATENT DOCUMENTS

DE    19645035    4/1998
(Continued)

OTHER PUBLICATIONS

European Office Action for counterpart application No. 03 075 791.8 dated Feb. 19, 2010.

*Primary Examiner* — Jerome Jackson, Jr.
(74) *Attorney, Agent, or Firm* — Koppel, Patrick, Heybl & Philpott

(57) ABSTRACT

A light emitting diode (LED) grown on a substrate doped with one or more rare earth or transition elements. The dopant ions absorb some or all of the light from the LED's active layer, pumping the dopant ion electrons to a higher energy state. The electrons are naturally drawn to their equilibrium state and they emit light at a wavelength that depends on the type of dopant ion. The invention is particularly applicable to nitride based LEDs emitting UV light and grown on a sapphire substrate doped with chromium. The chromium ions absorb the UV light, exciting the electrons on ions to a higher energy state. When they return to their equilibrium state they emit red light and some of the red light will emit from the LED's surface. The LED can also have active layers that emit green, blue and UV light, such that the LED emits green, blue, red and UV light which combines to create white light. Alternatively, it can have one active layer and grown on a sapphire substrate doped with Cr, Ti, and Co such that the substrate absorbs the UV light and emits blue, green, and red light. The invention is also capable of providing a tunable LED over a variety of color shades. The invention is also applicable to solid state lasers having one or more active layers emitting UV light with the laser grown on a sapphire substrate doped with one or more rare earth of transition elements.

11 Claims, 4 Drawing Sheets

U.S. PATENT DOCUMENTS

| | | | |
|---|---|---|---|
| 5,684,309 A | 11/1997 | McIntosh | 257/191 |
| 5,757,026 A | 5/1998 | Forrest et al. | 257/40 |
| 5,898,185 A | 4/1999 | Bojarczuk | 257/103 |
| 5,952,681 A | 9/1999 | Chen | 257/89 |
| 6,093,941 A | 7/2000 | Russell et al. | 257/103 |
| 6,166,489 A | 12/2000 | Thompson et al. | 313/506 |
| 6,212,213 B1 | 4/2001 | Weber et al. | 372/50 |
| 6,239,901 B1 | 5/2001 | Kaneko | 359/326 |
| 6,255,669 B1 | 7/2001 | Birkhahn et al. | 257/89 |
| 6,337,536 B1 | 1/2002 | Matsubara et al. | 313/498 |
| 2002/0003233 A1 | 1/2002 | Mueller-Mach et al. | |

FOREIGN PATENT DOCUMENTS

| | | |
|---|---|---|
| JP | 10056203 | 2/1998 |
| WO | WO9750132 | 12/1997 |
| WO | WO 98/12757 | 3/1998 |

MULTI ELEMENT, MULTI COLOR SOLID STATE LED/LASER

This application is a continuation from, and claims the benefit of, patent application Ser. No. 10/815,426 filed Mar. 31, 2004, now U.S. Pat. No. 7,084,436 to DenBaars et al., which is a divisional of U.S. patent application Ser. No. 09/528,262 filed Mar. 17, 2000, now U.S. Pat. No. 7,202,506 also to DenBaars et al.

This invention was made with Government support under Contract No. 70NANB8H4022, awarded by the NIST (ATP). The Government has certain right in this invention.

The following application is a utility application for provisional application No. 60/166,444 to Denbaars et al., which was filed on Nov. 19, 1999.

BACKGROUND OF THE INVENTION

1. Field of the Invention

This invention relates to solid state light emitting diodes (LEDs) and lasers that can emit various colors of light, including white.

2. Description of the Related Art

Light emitting diodes (LEDs) are an important class of solid state devices that convert electric energy to light. They generally comprise one or more active layers of semiconductor material sandwiched between oppositely doped layers. When a bias is applied across the doped layers, holes and electrons are injected into the active layer where they recombine to generate light. Light is emitted omnidirectionally from the active layer and from all surfaces of the LED. The useful light is generally emitted in the direction of the LED's top surface, which is usually p-type.

One disadvantage of conventional LEDs is that they cannot generate white light from their active layers. One way to produce white light from conventional LEDs is to combine different colors from different LEDs. For example, the light from red, green and blue LEDs, or blue and yellow LEDs can be combined to produce white light. One disadvantage of this approach is that it requires the use of multiple LEDs to produce a single color of light, increasing costs. In addition, different colors of light are often generated from different types of LEDs which can require complex fabrication to combine in one device. The resulting devices can also require complicated control electronics since the different diode types can require different control voltages. Long term wavelength and stability of these devices is also degraded by the different aging behavior of the different LEDs.

More recently, the light from a single blue emitting LED has been converted to white light by surrounding the LED with a yellow phosphor, polymer or dye. [See Nichia Corp. white LED, Part No. NSPW300BS, NSPW312BS, etc., which comprise blue LEDs surrounded by a yellow phosphor powder.; see also U.S. Pat. No. 5,959,316 to Hayden, entitled Multiple Encapsulation of Phosphor-LED Devices.] The surrounding material "downconverts" the wavelength of some of the LED light, changing its color. For example, if a nitride based blue emitting LED is surrounded by a yellow phosphor, some of the blue light will pass through the phosphor without being changed while the remaining light will be downconverted to yellow. The LED will emit both blue and yellow light, which combine to produce white light.

However, the addition of the phosphor results in a more complex LED that requires a more complex manufacturing process. In addition, the net light emitting efficiency is reduced due to the absorption in the phosphor and the stokes shift from blue to yellow. Other examples of LEDs using this approach include U.S. Pat. No. 5,813,753 to Vriens et al., and U.S. Pat. No. 5,959,316 to Lowery.

Another disadvantage of most conventional LEDs is that they are less efficient at converting current to light compared to filament lights. However, recent advances in nitride based LEDs have resulted in highly efficient blue light sources, and their efficiency is expected to surpass filament (and flourescent) based light sources. However, conventional blue LEDs operate from a relatively low supply current that results in a light that is too dim for many lighting applications. This problem is compounded by the absorption of some of the blue light by the downconverting material used to generate white light from blue. For blue LEDs to provide a bright enough light source for room illumination, the current applied to the LED must be increased from the conventional 20-60 mAmps to 0.8-1 Amp. At this current, LEDs become very hot and any material surrounding the LED will also become hot. The heat can damage the downconverting material surrounding the LED, degrading its ability to downconvert the LED's light. The heat can also present a danger of burning objects that are near to or in contact with the LED.

Another disadvantage of conventional LEDs is that they only emit one color of light. In conventional multi-color LED displays, different LEDs must be included to generate different colors of light. In applications such as displays or television screens, this can result in a prohibitive number of LEDs and can require complex control electronics.

Solid state lasers convert electrical energy to light in much the same way as LEDs. [Prentice Hall, *Laser Electronics* 2$^{nd}$ *Edition*, J. T. Verdeyen, Page 363 (1989)]. They are structurally similar to LEDs but have mirrors on two opposing surfaces. In the case of edge emitting lasers, the mirrors are on the device's side surfaces and reflect light generated by the active layer until it reaches a high enough energy level to escape from the side of the laser, through one of the mirrors. This results in a highly collimated/coherent light source. A vertical cavity laser works much the same as an edge emitting laser, but the mirrors are on the top and the bottom. Light from the active layer reflects between the mirrors until it reaches a stimulated emission level, providing a similar collimated light source from the laser's top surface.

However, conventional solid state lasers cannot efficiently emit green and blue light. Red emitting solid state lasers are more common, but their performance degrades with temperature and if the temperature reaches a high enough point, the laser will stop emitting light.

SUMMARY OF THE INVENTION

The present invention provides new LEDs and solid state lasers that are grown on substrates doped with one or more rare earth or transition elements. The new LED/lasers rely on the light absorption and emission properties of the doped substrate to produce new colors of light. In LEDs having multiple emitting layers or substrates doped with more that one element, the supply current can be manipulated such that a single LED can produce more than one color. One particular advantage of the invention is that it provides a new white light emitting LED.

The new LED can have one or more active layers that emit light omnidirectionally, with some of the light emitting from the LED's surface and some of it passing into its doped substrate. Depending on the type of substrate and dopant, the substrate will absorb light within a limited range of wavelengths. A light within this absorption range pumps the electrons on the dopant ions to a higher energy state. The pumped electrons are drawn back to their natural equilibrium state and emit energy as light at a wavelength that depends upon the type of dopant ion. Light is emitted omnidirectionally, including through the surface of the LED. The wavelength of light emitted from the dopant ion will be different than that emitted by the active layers, effectively changing the color of light emitted from the overall device.

The new LED can have one or more active layers, and is preferably made of Al—Ga—In—N ("nitride") based semiconductor materials. The LED is grown on a sapphire substrate that is doped by one of the rare earth or transition elements, such as chromium (Cr). Doping sapphire with CR creates ruby which is particularly useful as a substrate for nitride based LEDs. Ruby absorbs ultraviolet (UV) light with a wavelength of about 400-420 nanometers (nm), which can be efficiently emitted by nitride based LEDs. The energy from the absorbed light pumps the electrons of the Cr ion to a higher energy state and as the electrons return to their equilibrium state, they emit energy as red light. The light is emitted omnidirectionally with some of it emitting from the surface of the LED along with the active layer's UV light. The UV light will not be visible to the eye and, as a result, the new LED will appear as though it is emitting red light.

The new LED can also have multiple active layers which emit different wavelengths of light. In one embodiment, the LED is grown on a ruby substrate and has active layers which produce green light, blue light, and UV light. The substrate will not absorb the green or blue light, but will absorb the UV light and emit red light omnidirectionally as the pumped dopant ions return to equilibrium. Green, blue, and red light will emit from the surface of the LED and will combine to produce a white light. Because this embodiment does not use conversion materials, it can operate at elevated current levels.

Another important advantage of the new multiple active layer LED is that, if desired, the active layers can be excited individually or in combination. This allows the new LED to be "tunable" and emit different colors by manipulating the current applied to the various active layers. The new LED can emit green, blue, or red if only one of the active layers are excited, or it can emit purple, aqua, or yellow if two of the active layers are excited.

As the level of current is increased across an active layer, it will emit brighter light. Accordingly, the level of current applied to each active layer can also be manipulated to vary the color emitting from the LED.

The doped substrate approach can also be used in solid state lasers to more efficiently produce blue and green light. By doping a sapphire substrate with cobalt (Co), UV light from the lasers active layer that enters the substrate will be absorbed and re-emitted as green light for stimulated emission.

The invention can be used to create more temperature resistant red lasers. In one embodiment, the laser can be nitride based and emit UV light from its active layer. The laser can be grown on a ruby substrate which emits red light in response to absorbed UV light. Both UV and red light will emit from the laser but it will appear as though only red light is being emitted. Different types of lasers emitting different colors of light can also be made.

These and other further features and advantages of the invention will be apparent to those skilled in the art from the following detailed description, taken together with the accompanying drawings, in which:

DETAILED DESCRIPTION OF THE INVENTION

Figure 1:
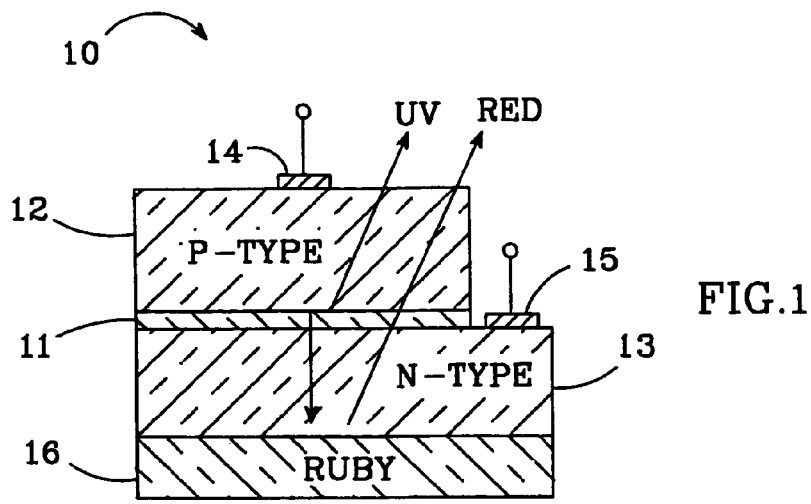
FIG. 1 is a sectional view of a new LED grown on a ruby substrate and having a UV emitting active layer.

FIG. 1 shows a single active layer nitride based LED 10 constructed in accordance with the invention. It has an InGaN active layer 11 which emits UV light, sandwiched between two oppositely doped GaN layers 12 and 13. The top layer 12 is usually p-type GaN and bottom layer 13 is usually n-type GaN although the new LED would also work if the layers were reversed. The p-type layer and n-type layers have respective contacts 14 and 15, each having a lead to apply a bias across the active layer 11, causing it to emit light omnidirectionally. The entire LED is grown on a sapphire ($Al_2O_3$) substrate doped with chromium (Cr), which creates ruby. Ruby is commercially available from companies such as Union Carbide in a form that can be used for substrates on solid state devices. The LED can be grown on the substrate by many known methods with the preferred method being Metal Organic Chemical Vapor Deposition (MOCVD).

Some of the light emitted from active layer 11 will pass through its top surface and some will pass into the ruby substrate 16. The UV light emitted from the top surface will not be visible. Some or all of the light passing into the substrate 16 will be absorbed, pumping the substrate's Cr electrons to a higher energy state. As the electrons return to their equilibrium state, they emit energy as red light at a wavelength of about 630 nm. This light will emit omnidirectionally, including through the top surface of the LED. Because the UV light is not visible, the new LED will appear as though it is only emitting red light. Thus, the new LED provides red light without external conversion materials and without being combined with other colors or types of LEDs.

Ruby substrates also absorb yellow light at a wavelength of about 550 nm and, as the dopant electrons return to their equilibrium state, they emit red light. A nitride based LED can have an active layer made of AlGaN that emits yellow light having a wavelength of about 550 nm. Some of the light will pass into the ruby substrate and stimulate an emission of red light. Both yellow from the active layer and red light from the substrate will be emit from the LED's surface.

This new technique for producing different colors of LED light by doping their substrates can be used in light emitting devices made of many different material systems. The devices can have one or more active layers that can be double heterostructure, single quantum well, or multiple quantum well. The substrate can be made of many different materials other that sapphire, including but not limited to spinel, silicon carbide, gallium nitride, quartz YAGI, garnet, or oxide single crystal. It can also be made of other oxide materials such as lithium gallate, lithium niobate, or zinc oxide.

The substrate dopant can be many different rare earth or transition elements other than Cr, including but not limited to cobalt, titanium, iron, magnesium, nickel, erbium, neodymium, praseodymium, europium, thulium, ytterbium, or cerium. The different dopant and substrates will work like the ruby substrate, absorbing certain wavelengths of light and emitting different wavelengths of light when the pumped dopant ion electrons return to their equilibrium state. For example, if a sapphire substrate is doped with nickel or magnesium it will absorb UV light and emit green light. If a sapphire substrate is doped with iron or titanium, it will absorb UV and emit blue light. If doped with cobalt, it will absorb UV light and emit green light. The substrate can also use polymers that function much the same as the rare earth and transition element dopants.

Figure 2:
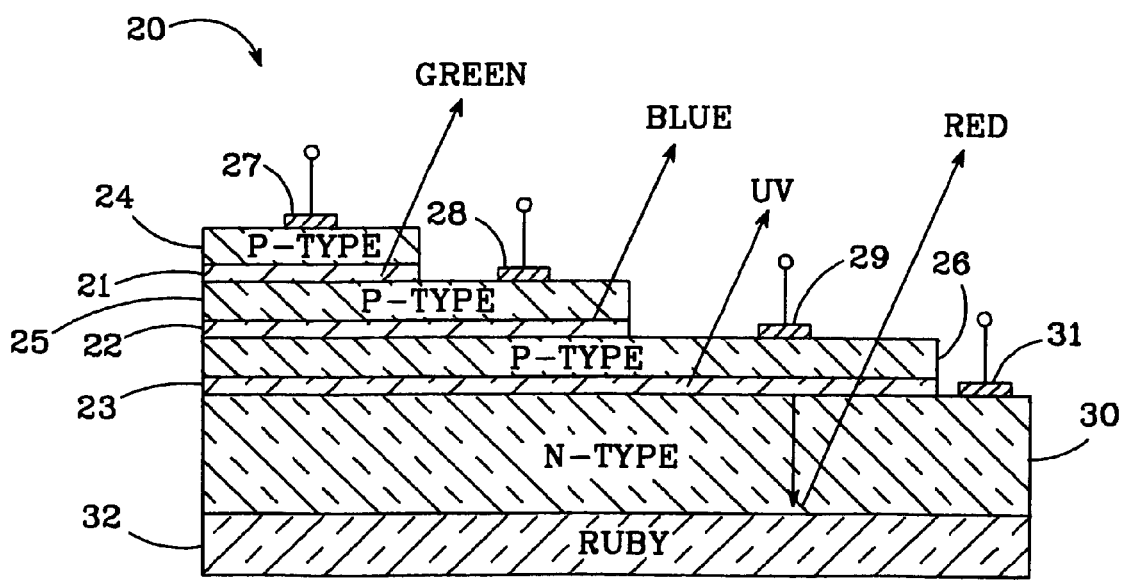
FIG. 2 is a sectional view of a new LED grown on a ruby substrate and having multiple active layers.

The substrate 16 can be doped with the desired rare earth or transition element by many doping methods. The preferred methods include solid state diffusion, ion implantation, beam evaporation, sputtering, or laser doping FIG. 2 shows another embodiment of the new LED 20 which is nitride based and has three active layers 21, 22 and 23, each of which emits a different wavelength of light. This allows the LED 20 to emit multiple colors that combine to produce white light. The active layers 21, 22 and 23 are composed of InGaN in different percentages such that they respectively emit green, blue and UV light with respective wavelengths of about 520 nm, 470 nm and 400 to 420 nm. Examples of the different percentages of In necessary in the active layer to produce various colors of light include: 0 percent (%) for UV Light, 5 to 10% for near UV light, 10 to 27% for blue light, 28 to 35% for green light, and 35 to 60% for yellow light.

The LED 20 has three p-type layers 24, 25 and 26, all made of GaN. P-type layer 24 is adjacent to active layer 21 and injects holes into the active layer 21 when a bias is applied to its contact 27. Similarly, p-type layer 25 injects holes into active layer 22 when a bias is applied to its contact 28, and p-type layer 26 injects holes into active layer 23 when a bias is applied to its contact 29. The n-type layer 30 is also made of GaN and is used to inject electrons into all active layers when a bias is applied to its contact 31, with the electrons migrating into each active layer 21, 22 and 23. The entire device is grown on a ruby substrate 32.

With a bias applied across the n-type contact 31 and all p-type contacts 27, 28, and 29 (usually in the range of 3 to 4 volts), each of the active layers 21, 22, and 23 will emit light omnidirectionally. Green, blue, and UV light will be emitted through the surface of the LED 20 and will also pass into the ruby substrate 32. The Cr in the substrate 32 will only absorb the UV light and as the Cr electrons return to their equilibrium state, they will emit red light. Some of the red light will emit from the LED's surface along with the green, blue, and UV light, all of which will combine to produce white light.

Another advantage of the new LED 20 is that a bias can be applied to one or more of the p-type contacts 27, 28, and 29, which allows the LED 20 to selectively emit different colors of light. For example, with a bias applied to p-type contact 27 and n-type contact 31, holes and electrons are primarily injected into active layer 21 and it emits green light. The light will not be absorbed by the ruby substrate and as a result, the LED 20 only emits green light. Similarly, with a bias applied to p-type contact 28 and n-type contact 31, the LED 20 emits only blue light. With a bias applied to p-type contact 29 and n-type contact 31, active layer 23 emits UV light that the ruby substrate absorbs and re-emits as red light. Thus, by applying a bias to one of the three p-type contacts 27, 28, and 29, the LED 20 can selectively emit green, blue, or red light.

With a bias applied to across the n-type contact 31 and two of the three p-type contacts 27, 28 and 29, two colors of light emit from the LED 20 that combine to produce additional colors. With a bias applied to contacts 27 and 28, green and blue light emit and combine to produce aqua. With a bias applied to contacts 27 and 29, green and red light emit and combine to produce yellow. With a bias applied to contacts 28 and 29, blue and red light emit to produce purple.

The brightness of light emitted from the various active layers is dependant upon the level of current that is applied to the respective contacts; the greater the current, the brighter the light and vice versa. Increasing or decreasing the level of the current to the active layers 21, 22, and 23, can produce variations in the colors of light emitted from the LED 20. For example, with a standard current applied to the blue active layer 22, and an increased current applied to the green active layer 21, the aqua emitted by the LED 20 would have more green compared to the aqua emitted if both active layers 21 and 22 received a normal current. This allows even greater flexibility in the colors of light emitted from the LED 20.

Figure 3:
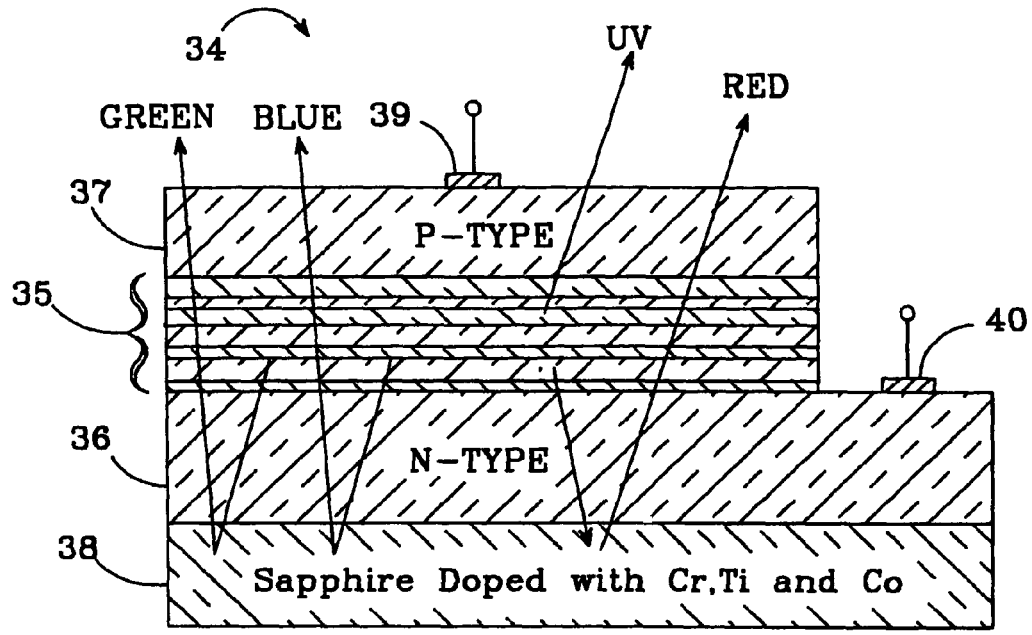
FIG. 3 is a sectional view of a new LED grown on a sapphire substrate doped with multiple elements, and having a UV emitting multiple quantum well active layer.

White light can also be produced by a new LED generating only one color of light from its active layer, by doping the substrate with more than one rare earth or transition element. FIG. 3 shows another embodiment of the new LED 34 being nitride based and having a UV emitting multiple quantum well active layer 35 made of InGaN, although other types of active layers can also be used. It is sandwiched between a GaN n-type layer 36 and a GaN p-type layer 37. When a bias is applied across the p-type contact 39 and n-type contact 40, the active layer 35 will emit UV light with some of it emitting from the LED surface and some of it passing into the substrate 38. The substrate 38 is doped with Cr which absorbs UV light and emits red light, Titanium (Ti) which absorbs UV light and emits blue light, and Cobalt (Co) which absorbs UV light and emits green light. The red, green, and blue light will be emitted from the substrate omnidirectionally, with some of it emitting from the LED's surface to produce white light.

Figure 4:
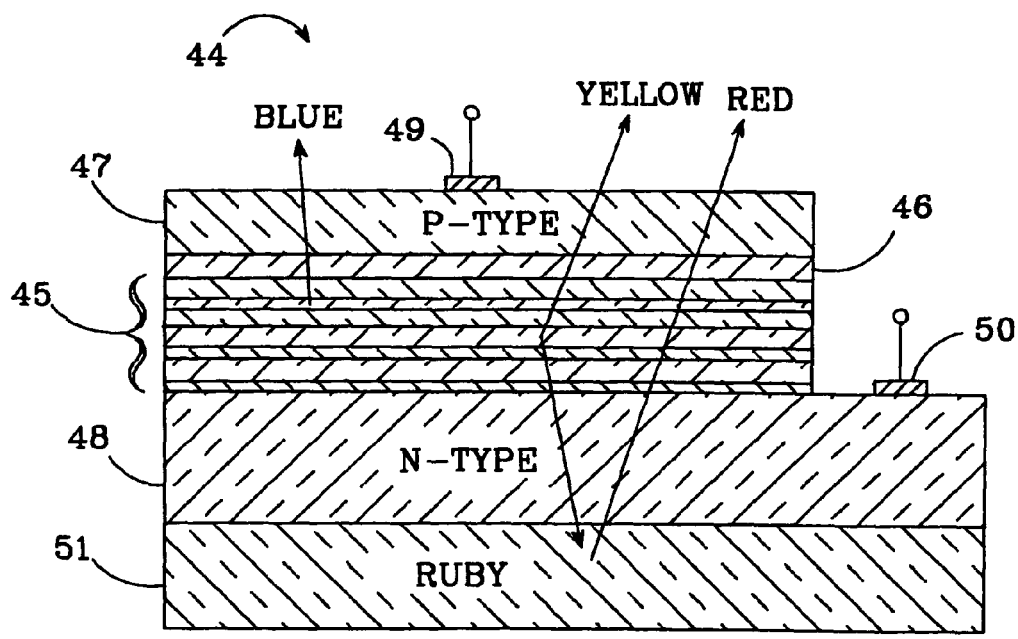
FIG. 4 is a sectional view of a new LED grown on a ruby substrate, and having a blue and yellow emitting multiple quantum well active layer.

FIG. 4 shows another embodiment of the new LED 44 with an InGaN multiple quantum well active layer 45, although other types of active layers can also be used. The active layer 45 emits blue light with a wavelength of about 470 nm and yellow light with a wavelength of about 550 nm. The LED 44 has a AlGaN layer 46 on top of the active layer 45 with a p-type GaN layer 47 on top of the AlGaN layer 46. It also has an n-type GaN layer 48 below the active layer 45. A bias is applied across the active layer 45 through a p-type contact 49 and an n-type contact 50. All of the LED layers are grown on a ruby substrate 51.

When a bias is applied to the contacts 49 and 50, holes and electrons are injected into the active layer 45 which causes it to emit blue and yellow light. Some of the light emits from the surface of the LED 44 and some of it passes into the ruby substrate 51, which absorbs the yellow light and emits red light. The blue light will pass through the substrate 51 and will not be absorbed. Blue, yellow and red light will emit from surface of the LED 44 and combine to create a warm white light.

Figure 5:
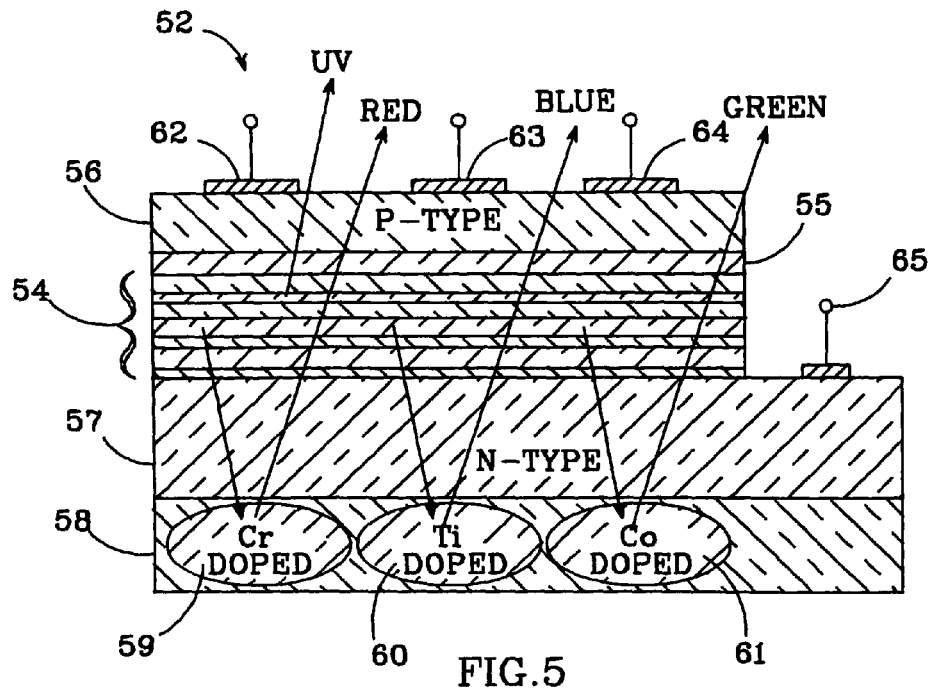
FIG. 5 is a sectional view of a new LED grown on a sapphire substrate having doped color centers, and having a multiple quantum well active layer.

The new LED can also generate different colors of light by doping the substrate with "color centers" of various rare earth and transitional elements. The color centers consist of bodies of different doping materials within the substrate. FIG. 5 shows the new LED 52 grown on a substrate 58 which contains three color centers 59, 60, and 61. The LED comprises a multiple quantum well active layer 54 of InGaN which emits UV light. A p-type AlGaN layer 55 is grown on the active layer, a p-type GaN layer 56 is grown on the AlGaN layer 55, and an n-type GaN layer 57 is grown below the active layer 54. The entire LED 52 is grown on a sapphire substrate 58 that has a Cr doped color center 59, a Ti doped color center 60, and a Co doped color center 61.

The LED 52 also includes an n-type contact 65 and three p-type contacts 62, 63, and 64, on the p-type layer 56, each p-type contact above a respective color center. By manipulating the bias applied to the various contacts, the color emitted by the LED 52 can be changed. With a bias applied to the n-type contact 65 and p-type contact 62, the active layer 54 generates light primarily below the contact 62 and the light from the active layer passes into the substrate 58 such that most of it passes into the Cr doped color center 59. Some or all of the light will be absorbed by the color center 59 and re-emitted as red light. With a bias instead applied to the p-type contact 63, the majority of light from the active layer enters the substrate at the Ti doped color center 60 which absorbs some or all of the light and re-emits blue light. Finally, with a bias applied at the p-type contact 64, the majority of light enters the substrate at the Co color center which absorbs some of the light and re-emits green light. Accordingly, by applying a bias across the n-type contact and one p-type contact, the LED 52 can selectively emit red, blue and green light.

Like the LED 20 in FIG. 2, a bias across the n-type contact 65 and more than one p-type contact 62, 63, and 64, creates different colors such as aqua, yellow, purple, and white. They are created by combining the colors from the different emitting color centers. The level of the current applied to the contacts can also be increased or decreased to provide variations of the colors emitting from the LED 52. The greater the current applied to a p-type contact 59, 60, and 61, the greater the intensity of light emitted from the active layer 54 below the contact, and the greater the intensity of light absorbed and emitted from the color center below the contact. When the intensity of a particular color is increased, it will be more dominant when combined with light from the other color centers.

Figure 6:
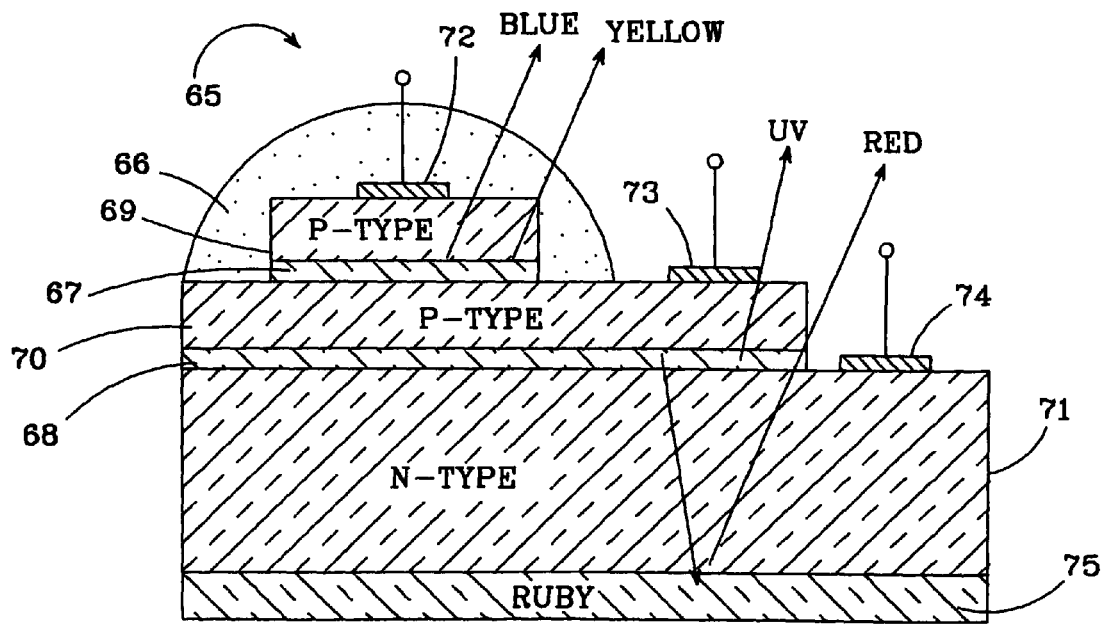
FIG. 6 is a sectional view of new LED grown on a ruby substrate and having two active layers, one of which is partially surrounded by a downconverting material.

FIG. 6 shows another embodiment of the new LED 65 that is partially surrounded by a YAG:Ce downconverting material 66. The LED 65 has an active layer 67 emitting blue light with a wavelength of about 470 nm and an active layer 68 below it, emitting UV light having a wavelength of about 420 nm. It also has two p-type layers 69 and 70 and an n-type layer 71 all of which have a respective contact 72, 73, and 74. The downconverting material 66 partially surrounds the top active layer 67 and it absorbs some of the blue light and downconverts it to yellow light. The LED is grown on a ruby substrate 75 that absorbs the UV light from the lower active layer 68 and re-emits red light. As a result, the LED 65 emits blue, yellow and red light that combines to create white light.

Many other embodiments of the new LED can be constructed in accordance with the invention. The new LED can be grown on a ruby substrate and have three active layers, one emitting light with a wavelength of about 400-420 nm, another emitting light with a wavelength of about 500 nm and the last emitting light with a wavelength of about 550 nm. Another embodiment can be grown on a ruby substrate and have three active layers, one emitting light with a wavelength of about 400-420 nm, another emitting light with a wavelength of about 470 nm and the last emitting light with a wavelength of about 520 nm. The LED can also be grown on a ruby substrate and have two active layers, one emitting about 400-420 nm light and the other emitting about 500 nm light, or it can be grown on a ruby substrate and have two active regions one emitting about 500 nm light and the other emitting about 550 nm light.

Figure 7:
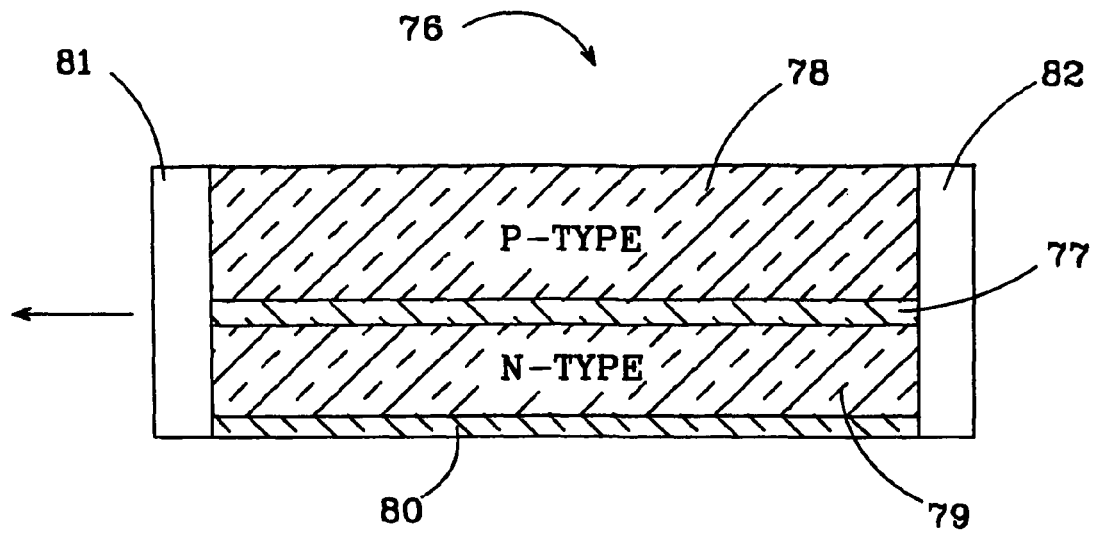
FIG. 7 is a sectional view of a nitride based edge emitting solid state laser, grown on a doped substrate.

The present invention can also be used with solid state laser such as edge emitting lasers and vertical cavity lasers. FIG. 7 shows an nitride based edge emitting laser 76 which is structurally similar to a LED. It has an InGaN active layer 77 sandwiched between a p-type GaN layer 78 and an n-type GaN layer 79, all of which are grown on a substrate 80 that is doped with Co. The laser 76 also has mirrors 81 and 82 to reflect light between the mirrors until the light reaches a sufficient energy level to escape through mirror 81, resulting in a highly collimated/coherent light source.

When a bias is applied to the p and n-type layers 78 and 79 through electrical contacts (not shown), the active layer 77 will emit light omnidirectionally and some of the light will pass into the substrate 80. Some or all of the light will be absorbed and will re-emit as green. The light will reflect between the mirrors 81 and 82 to produce stimulated LED emission of UV light and green light. The UV light will not be visible to the eye and as a result, the laser 76 will appear as though it is emitting green light. Depending an the dopant used in the substrate 80, the color of the emitted light can be different, as described above. For example, the substrate can be doped with Cr such that it will absorb the UV light and emit red light. The new red laser is more temperature tolerant compared to conventional red solid state lasers.

Figure 8:
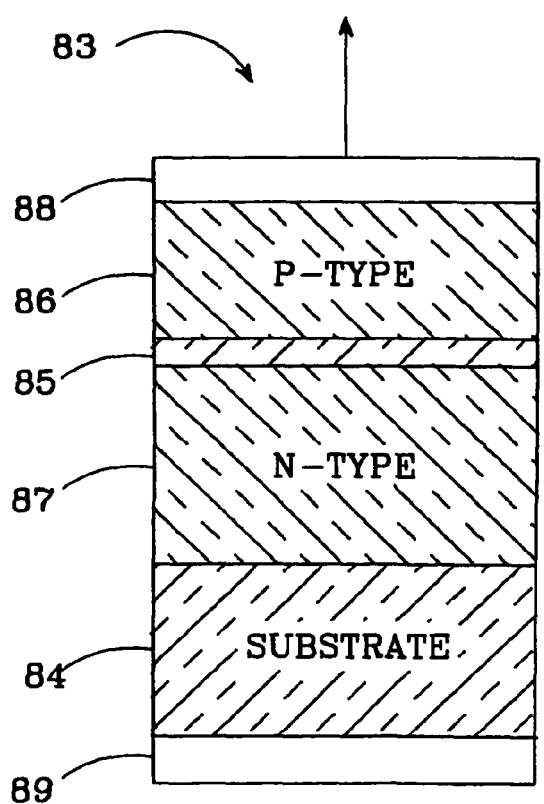
FIG. 8 is a sectional view of a nitride based top emitting solid state laser grown on a doped substrate.

FIG. 8 shows a vertical cavity laser 83 which works much the same as an edge emitting laser and also has a doped substrate 84 and a UV emitting active layer 85 sandwiched between two oppositely doped layers 86 and 87. It has a mirror on its top surface 88 and its bottom surface 89 and the collimated light is generally emitted through the top mirror 88. In operation, the light from the active layer 85 emits omnidirectionally and some of it will reflect between the mirrors 88 and 89 to reach stimulated emission. Some of the light from the active layer 85 will also enter the substrate 84 where it will be absorbed and emit a different color depending on the dopant in the substrate. The light from the substrate 84 will also reflect between the mirrors 88 and 89 and emit from the top surface as a collimated light. The UV light will not be visible and the laser will appear as though it is only emitting the wavelength of light from its substrate 84.

Figure 9:
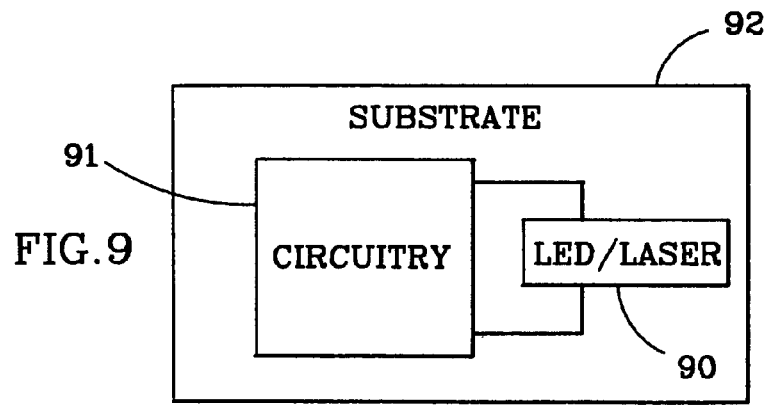
FIG. 9 is a block diagram of the new LED/laser, connected to electrical circuitry.

FIG. 9 shows the new LED/laser 90, connected to electrical circuitry 91 that can perform various functions such as power conversion or conditioning. The circuitry can also control the biases applied to the various contacts on the LEDs described above, to control the colors the LEDs emit. In one embodiment, the electrical circuitry can be on a common substrate 92 with the LED/laser 90.

Although the present invention has been described in considerable detail with reference to certain preferred configurations thereof, other versions are possible. Therefore, the spirit and scope of the appended claims should not be limited to their preferred versions contained therein.

We claim:
1. A solid state light emitting device, comprising:
a light emitting diode (LED), including:
a plurality of active layers, said active layers capable of emitting two or more different wavelengths of light in a wavelength range from green to ultraviolet (UV);
a plurality of doped layers, each of said active layers sandwiched between a pair of oppositely doped layers, said oppositely doped layers causing said active layers to emit light at a predetermined wavelength in response to an electrical bias across said doped layers; and a doped substrate, said active layers and doped layers disposed successively on said substrate, wherein said substrate is doped by one or more rare earth or transition elements in separate color centers each comprising a doped body within said substrate, each of said color centers capable of absorbing at least some of said light from at least one of said active layers and re-emitting light at a different wavelength, said LED emitting a combination of light from said substrate and said active layers.

2. The light emitting device of claim 1, wherein said active layers emit blue, green, and UV light and said substrate comprises sapphire doped with a chromium color center, which absorbs said UV light and re-emits red light, said LED emitting blue, green, UV, and red light when all said active layers are emitting, in a white light combination.

3. The light emitting device of claim 2, wherein each said active layers can selectively emit light, said LED emitting primarily red, green, or blue light when one of said active layers is emitting, or said LED emitting primarily purple, aqua, yellow, or white light when more than one of said active layers is emitting.

4. A solid state light emitting device, comprising:
a light emitting diode (LED), including:
a plurality of active layers, said active layers emitting blue and yellow light;
a plurality of doped layers, each of said active regions sandwiched between a pair of said plurality of oppositely doped layers, said oppositely doped layers causing said active layers to emit light at a predetermined wavelength in response to an electrical bias across said doped layers; and
a doped substrate, said active layers and doped layers disposed successively on said substrate, wherein said substrate is doped with multiple rare earth or transition elements each in separate color centers, at least one of said color centers doped with chromium, wherein said substrate absorbs at least some of said yellow light from at least one of said active layers and re-emits red light, said LED emitting a combination of light from said substrate and said active layers.

5. The light emitting device of claim 1, wherein said active layers emit blue light and UV light, said substrate having a color center that absorbs at least some of said UV light and re-emits red light, said LED further comprising down-converting material around the surface of said LED that absorbs some of said blue light emitting from that surface and re-emits yellow light.

6. A nitride based light emitting diode (LED), comprising:
a plurality of active layers capable of emitting two or more different wavelengths of light at predetermined wavelengths;
a means for selectively causing each of said plurality of active layers to emit light alone or in combination with others of said plurality of active layers; and
a doped substrate, said plurality of active layers arranged vertically on said substrate with a plurality of doped semiconductor layers with each of said active layers sandwiched between two doped layers, said substrate doped by one or more rare earth or transition elements in separate color centers each comprising a doped body within said substrate, each of said color centers capable of absorbing at least some of said light from at least one of said plurality of active layers and re-emitting light at a different wavelength, further comprising at least two pairs of electrical contacts, each of said at least two pairs of electrical contacts arranged to apply a bias across a respective one of said pairs of oppositely doped layers.

7. A solid state light emitting device, comprising:
a light emitting diode (LED), including:
a plurality of active layers, said active layers capable of emitting two or more different wavelengths of light in a wavelength range from green to ultraviolet (UV);
a plurality of doped layers, each of said active layers sandwiched between a pair of oppositely doped layers, said oppositely doped layers causing said active layers to emit light at a predetermined wavelength in response to an electrical bias across said doped layers; and
a doped substrate, said active layers and doped layers disposed successively on said substrate, wherein said substrate absorbs at least some of said light from at least one of said active layers and re-emits light at a different wavelength, said LED emitting a combination of light from said substrate and said active layers, wherein said active layers emit green, red, and UV light and said substrate is doped with doped multiple rare earth or transition elements each in separate color centers, at least one of said color centers doped with iron or titanium, said substrate absorbing said UV light and re-emitting blue light, said LED emitting green, UV, red, and blue light when all said active layers are emitting, in a white light combination.

8. A solid state light emitting device, comprising:
a light emitting diode (LED), including:
a plurality of active layers, said active layers capable of emitting two or more different wavelengths of light in a wavelength range from green to ultraviolet (UV);
a plurality of doped layers, each of said active layers sandwiched between a pair of oppositely doped layers, said oppositely doped layers causing said active layers to emit light at a predetermined wavelength in response to an electrical bias across said doped layers; and
a doped substrate, said active layers and doped layers disposed successively on said substrate, wherein said substrate absorbs at least some of said light from at least one of said active layers and re-emits light at a different wavelength, said LED emitting a combination of light from said substrate and said active layers, wherein said active layers emit blue, red, and UV light and said substrate is doped with multiple rare earth or transition elements each in separate color centers, at least one of said color centers doped with cobalt, nickel, or magnesium, said substrate absorbing said UV light and re-emits re-emitting green light, said LED emitting blue, red, UV, and green light when all said active layers are emitting.

9. A solid state light emitting device, comprising:
a light emitting diode (LED), including:
a plurality of active layers, said active layers capable of emitting two or more different wavelengths of light in a wavelength range from green to ultraviolet (UV);

a plurality of doped layers, each of said active layers sandwiched between a pair of oppositely doped layers, said oppositely doped layers causing said active layers to emit light at a predetermined wavelength in response to an electrical bias across said doped layers; and a doped substrate, said active layers and doped layers disposed successively on said substrate, wherein said substrate absorbs at least some of said light from at least one of said active layers and re-emits light at a different wavelength, said LED emitting a combination of light from said substrate and said active layers, said substrate doped with multiple rare earth or transition elements each in separate color centers, at least one of said color centers doped with cobalt, wherein said active layers emit green and UV light and said substrate absorbs a portion of said UV light and re-emits red light.

10. The light emitting device of claim 5, said down-converting material comprising phosphor, wherein said phosphor is dispersed throughout a phosphor layer.

11. The light emitting device of claim 10, said phosphor layer comprising an encapsulant.

* * * * *